United States Patent [19]
Assard et al.

[11] Patent Number: 5,883,548
[45] Date of Patent: Mar. 16, 1999

[54] DEMODULATION SYSTEM AND METHOD FOR RECOVERING A SIGNAL OF INTEREST FROM AN UNDERSAMPLED, MODULATED CARRIER

[75] Inventors: Gerald L. Assard, Waterford, Conn.; Antonio L. Deus III, Westerly, R.I.; Barry A. Blakely, Essex, Vt.

[73] Assignee: The United States of America as represented by the Secretary of the Navy, Washington, D.C.

[21] Appl. No.: 967,741

[22] Filed: Nov. 10, 1997

[51] Int. Cl.$^6$ ........................................ H04L 27/38
[52] U.S. Cl. .......................... 329/306; 359/325; 375/324
[58] Field of Search .................................. 329/304, 305, 329/306, 308, 309; 375/324, 325, 327; 359/325

[56] References Cited

U.S. PATENT DOCUMENTS

| 3,693,082 | 9/1972 | Jaecklin | 324/96 |
| 5,640,125 | 6/1997 | Alard | 329/306 |
| 5,719,673 | 2/1998 | Dorsel et al. | 356/345 |

*Primary Examiner*—Siegfried H. Grimm
*Attorney, Agent, or Firm*—Michael J. McGowan; Michael F. Oglo; William F. Eipert

[57] ABSTRACT

A demodulation system and method is used in a sensor system, such as a fiber optic sensor system, that senses optical signals and modulates a phase generated carrier having a carrier frequency $\omega_c$ to form a modulated carrier. The modulated carrier is preferably undersampled at three times the carrier frequency ($3\omega_c$), thereby maximizing the sensors' demodulated bandwidth relative to the sensors' sampling frequency. The undersampled, modulated carrier is orthogonally demodulated by multiplying the undersampled, modulated carrier by $\cos(\omega_c(t_o))$ and $\sin(\omega_c)(t_o))$ to extract even and odd harmonic components of the signal of interest. The even and odd harmonic components of the signal of interest are further demodulated by taking the square root of the sum of squares of the even and odd harmonic components, normalizing the even and odd harmonic components, and differentiating, cross-multiplying and differencing the normalized even and odd harmonic components to recover the signal of interest.

15 Claims, 3 Drawing Sheets

DEMODULATION SYSTEM AND METHOD FOR RECOVERING A SIGNAL OF INTEREST FROM AN UNDERSAMPLED, MODULATED CARRIER

STATEMENT OF GOVERNMENT INTEREST

The invention described herein may be manufactured and used by or for the Government of the United States of America for governmental purposes without the payment of any royalties thereon or therefor.

CROSS REFERENCES TO RELATED PATENT APPLICATION

The instant application is related to a co-pending U.S. patent application Ser. No. 08/967,740 entitled SYSTEM AND METHOD FOR RECOVERING A SIGNAL OF INTEREST FROM A PHASE MODULATED SIGNAL USING QUADRATRUE SAMPLING (Navy Case No. 77268) having same filing date.

BACKGROUND OF THE INVENTION (1). Field of the Invention

The present invention relates to systems and methods of demodulation and in particular, to a demodulation system and method for demodulating an undersampled, modulated carrier signal to recover a signal of interest.

(2). Description of the Prior Art

In communication systems, modulation is commonly used to transmit information from an information source, such as a sensor system where information is detected, to an information destination, such as a receiver system where detected signals are received and processed. According to conventional modulation techniques, a signal of interest detected by a sensor modulates a carrier signal by modifying one or more characteristics of the carrier signal, such as amplitude, frequency or phase, to form a modulated carrier signal. The modulated carrier signal is then more easily transmitted over the appropriate communication channels to the destination or receiver system where the modulated carrier signal is demodulated to recover the signal of interest and determine the information.

One type of sensor system that employs modulation techniques includes fiber optic sensors, for example, as used in fiber optic interferometers for distance measurements. The fiber optic sensors detect or sense light signals that modulate the output phase of the sensor system or interferometer. The modulated carrier can then be photodetected and transmitted to a receiver system. In a system having an array of sensors, the signals are often multiplexed, for example, using time division multiplexing (TDM) and/or wavelength division multiplexing (WDM).

One type of modulation technique used in interferometers and other sensor systems uses phase generated carriers. The sensor's time varying phase signal (signal of interest) modulates the phase generated carriers to form a modulated carrier. Both the signal of interest and the phase generated carriers can be mathematically represented as a Bessel series of harmonically related terms. During modulation, the Bessel series of the signal of interest modulates the Bessel series of the phase generated carrier. The number of terms in the Bessel series of the resulting modulated carrier will be dependent upon the level of the measured or detected signal of interest. The harmonically related terms in the Bessel series of the modulated carrier represent both the measured or detected signal of interest and the carrier signal.

The homodyne receiver concept is typically used to demodulate the sensor information or signal of interest from an adjacent pair of modulated carriers. According to prior art demodulation techniques, a quadrature pair of modulated carriers must be multiplied by a local oscillator of the proper frequency, phase and amplitude. Matching the phase of the local oscillator with the phase of the modulated carrier is often tedious and inexact. If either the phase or amplitude are mismatched, the harmonic distortion of the demodulator will be increased.

Typical fiber optic sensor systems using phase generated carriers to transmit a detected or measured signal (i.e., signal of interest) to a receiver system have used a pair of quadrature carriers with frequencies of either $\omega_c$ and $2\omega_c$ or $2\omega_c$ and $3\omega_c$, where $\omega_c$ is the phase generated carrier frequency. In multiplexed sensor systems, the sensor sampling frequency $f_s$ must be selected to ensure that frequencies greater than $f_s/2$ are not aliased into the band of interest below $f_s/2$. Previous sampling frequencies were, therefore, greater than or equal to four times the frequency of the lowest frequency quadrature carrier. If carriers having a frequency of $\omega_c$ and $2\omega_c$ are used, for example, a minimum sampling frequency of $4\omega_c$ is required. Such a high sampling frequency often places great demands on the sampling circuitry.

SUMMARY OF THE INVENTION

Accordingly, one object of the present invention is to provide a system and method for recovering a measured or detected signal of interest from the quadrature components of a single modulated carrier.

Another object of the present invention is to maximize the sensors' demodulated bandwidth relative to the sensor system sampling frequency by undersampling the modulated carrier at three times the carrier frequency ($3\omega_c$).

The present invention features a system and method of recovering at least one signal of interest that is detected by at least one sensor and that modulates a carrier signal to form a modulated carrier signal having the form $f(t)=A+B\sin(C\cos(\omega_c(t)+Ph_c)+D\cos(\omega_h(t))+Ph_i(t))$, where A and B are detection factors, C is the amplitude of the carrier signal, $\omega_c$ is the carrier signal frequency ($2\pi f$), $Ph_c$ is the phase of the carrier signal relative to the sensor, D is amplitude of the signal of interest, $\omega_h$ is the radian frequency of signal of interest, and $Ph_i(t)$ is environmentally induced phase noise.

The method comprises the steps of: undersampling the modulated carrier signal; receiving the undersampled, modulated carrier signal; orthogonally demodulating the undersampled, modulated carrier signal by multiplying the modulated carrier signal by $\cos(\omega_c(t_o))$ to extract an even harmonic component of the signal of interest and multiplying the modulated carrier by $\sin(\omega_c(t_o))$ to extract an odd harmonic component of the signal of interest; and further demodulating the even harmonic component and the odd harmonic component of the undersampled, modulated carrier signal to recover the signal of interest. According to the preferred method, the modulated carrier is undersampled at three times the carrier frequency ($f_s=3\omega_c$).

The step of further demodulating the even harmonic component and odd harmonic component of the signal of interest preferably includes: taking the square root of the sum of the squares of the even harmonic component and the odd harmonic component; normalizing the even harmonic component and the odd harmonic component to form a normalized even harmonic component and a normalized odd harmonic component; and decoding the normalized even harmonic component and the normalized odd harmonic component, to recover the signal of interest. The step of decoding preferably includes: differentiating and cross-multiplying the normalized even harmonic component and said normalized odd harmonic component to form differentiated and cross-multiplied even and odd harmonic components; and differencing the differentiated and cross-multiplied even and odd harmonic components, to recover the signal of interest.

In a system having an array of sensors, the preferred method also includes multiplexing the modulated carrier signals using, for example, time division multiplexing (TDM), wavelength division multiplexing (WDM), or both. According to one embodiment, the sensor includes a fiber optic sensor in an array of fiber optic sensors, such as interferometers. In this embodiment the detection factor A represents the DC level of the light and the detection factor B represents the mixing efficiency of the sensor and the intensity of light.

The system for recovering the signal of interest from the modulated carrier according to the present invention includes sampling and demodulation circuitry for performing the above method.

BRIEF DESCRIPTION OF THE DRAWINGS

These and other features and advantages of the present invention will be better understood in view of the following description of the invention taken together with the drawings wherein.

DESCRIPTION OF THE PREFERRED EMBODIMENT

Figure 1:
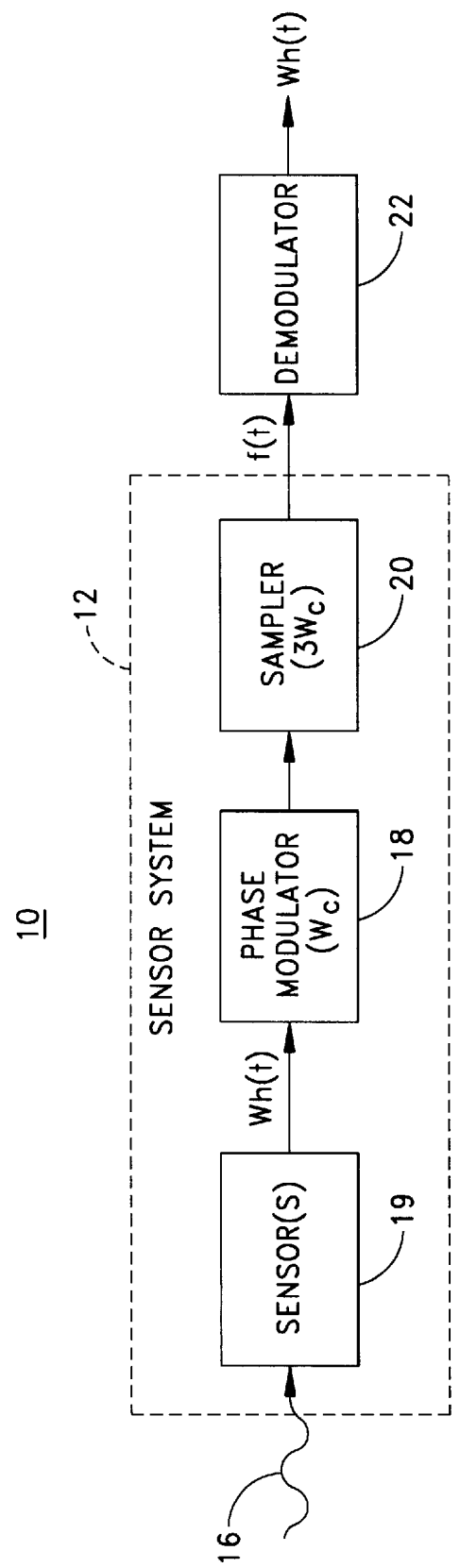
FIG. 1 is a schematic block diagram of a sensor system employing the system and method for recovering a detected signal of interest from an undersampled, modulated carrier signal according to the present invention.

A communications system 10, FIG. 1, employing the demodulation system and method of the present invention includes a sensor system 12 having one or more sensors 19, such as an array of fiber optic sensors in a fiber optic interferometer. The sensors 19 detect or sense one or more signals 16, such as light or optical signals from a laser source. The signal of interest ($D\cos\omega_h(t)$) sensed by the sensors 19 modulates a phase generated carrier signal having a carrier frequency ($\omega_c$) generated by a phase modulator 18, to form a modulated carrier signal. In a fiber optic interferometer, for example, the optical signals of interest modulate the output phase of the interferometer.

In one exemplary embodiment of the present invention, the demodulation system and method is used with a fiber optic interferometer having an array of fiber optic sensors 19. Such fiber optic sensor systems use the demodulation system and method of the present invention in combination with time division multiplexing (TDM) or wavelength division multiplexing (WDM), or a combination of the two, to sense and transmit a plurality of signals of interest from the array of fiber optic sensors. The present invention contemplates using the undersampling demodulation system and method with any system that employs quadrature carriers transmitted, for example, in transmission lines and/or through radio frequency airways.

The sensor system 12 further includes a sampler 20 that samples the modulated carrier signals prior to transmitting the modulated carrier signals to a receiver system or demodulator 22. The sampler 20 undersamples the modulated carrier signal, preferably at a sampling rate equal to three times the carrier frequency ($3\omega_c$), prior to the demodulation of the modulated carrier signal. In a fiber optic sensor system, a photodetector performs the sampling and converts the optical signal to an electronic signal.

The undersampling of the modulated carrier signal eliminates the need to demodulate two independent carriers, as required in prior art demodulation systems and methods employing quadrature carriers. The modulated carrier signals according to the present invention include odd harmonic components and even harmonic components (i.e., quadrature components) represented mathematically by real and imaginary Bessel terms $\omega_{c1}$, $\omega_{c2}$ in a Bessel expansion series. Because of the ordered structure of the Bessel terms in the modulated carrier signal, undersampling at $3\omega_c$ will result in aliasing all of the Bessel terms of the signal of interest into the sidebands of the odd and even components of a single carrier. Thus, both the real and imaginary terms (i.e., odd and even harmonic components) of the signal of interest are available under a single carrier.

The sidebands of the odd carrier components contain the odd harmonics of the signal of interest $D\cos\omega_h(t)$ and the sidebands of the even carrier components contain the even harmonics of the signal of interest $D\cos\omega_h(t)$. These sidebands are orthogonally related and represent the real and imaginary terms of the signal of interest $D\cos\omega_h(t)$.

The even harmonic components and odd harmonic components of the signal of interest (the real and imaginary terms) can then be recovered from a single modulated carrier signal. The undersampling also increases the time between samples and reduces the number of samples that must be processed relative to prior art systems, thereby reducing the demands on the sampling circuitry.

Figure 2:
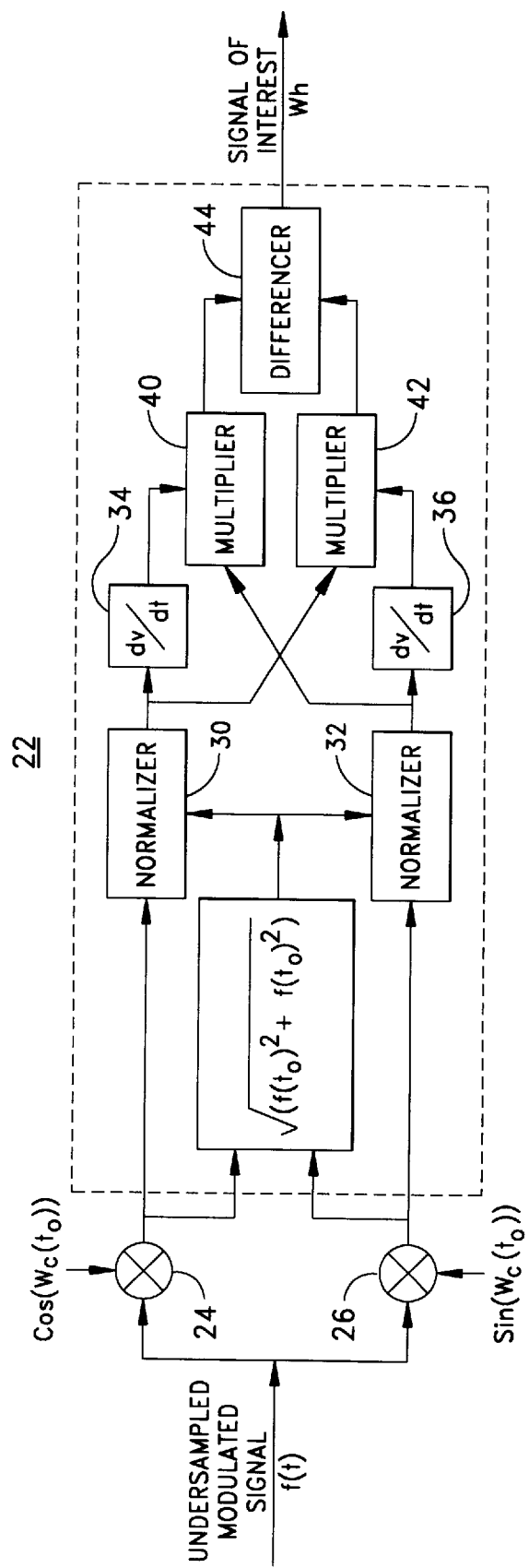
FIG. 2 is a schematic block diagram of a demodulator according to the present invention.

The undersampled modulated signal f(t) is received and demodulated by the demodulator 22, FIG. 2, to recover the signal of interest $D\cos(\omega_h(t))$. The modulated signal f(t) has the following form:

$$f(t)=A+B\sin(C\cos(\omega_c(t)+Ph_c)+D\cos(\omega_h(t))+Ph_i(t)) \qquad (1)$$

where A and B are detection factors, C is the amplitude of the carrier signal, $\omega_c$ is the carrier signal frequency ($2\pi f$), $Ph_c$ is the phase of the carrier signal relative to the sensor, D is the amplitude of the signal of interest, $\omega_h$ is the radian frequency of signal of interest, and $Ph_i(t)$ is environmentally induced phase noise. In the exemplary embodiment of a fiber optic interferometer, A is the DC level of the light and B is the mixing efficiency of the interferometer and the intensity of the light.

The magnitudes of the real and imaginary components of the signal of interest $D\cos\omega_h(t)$ are directly proportional to the magnitudes of their respective carrier terms $\omega_{c1}$, $\omega_{c2}$. The phase generated carrier's magnitude is adjusted so that the first and second Bessel terms $\omega_{c1}$, $\omega_{c2}$ of the carrier are equal in amplitude. The amplitude of the phase generated carrier terms $\omega_{c1}$, $\omega_{c2}$ is carefully matched to ensure equal amplitudes of the even and odd harmonic components of the signal of interest $D\cos\omega_h(t)$ and to ensure minimal distortion of the reconstructed or recovered signal of interest. The odd and even components are matched by comparing the magnitude of odd and even (i.e., real and imaginery) components and adjust the magnitude of one or the other to make their magnitudes equal. The magnitudes of the first and second Bessel terms are adjusted by adjusting the magnitude of the phase demodulator 22. Further adjustment of the magnitude of the harmonic components of the signal of interest $D\cos\omega_h(t)$ can occur by adjusting the magnitude of the odd and even harmonics during the orthogenal demodulation.

The demodulator 22 includes multipliers 24, 26 that orthogonally demodulate the undersampled, modulated signal f(t). The first multiplier 24 multiplies the undersampled, modulated signal by a signal of the form $\cos(\omega_c(t_o))$ and the second multiplier 26 multiplies the undersampled modulated signal f(t) by a signal of the form $\sin(\omega_c(t_o))$. The cosine (cos) and sine (sin) function multipliers 24, 26 extract equal amplitude even and odd harmonic components of the signal of interest $D\cos\omega_h(t)$ from the phase generated carrier $\omega_c(t)$.

As mentioned above since the modulated signal has been undersampled at $3\omega_c$, the even and odd harmonic components of the signal of interest $D\cos\omega_h(t)$ are aliased into the sidebands of a single phase generated carrier and can be extracted from a single phase generated carrier by this orthogonal demodulation step. Demodulating the undersampled, modulated signal is also less demanding because local oscillators of the same frequency can be used to extract the odd and even components of the signal of interest from the single phase generated carrier.

As a result of the undersampling, the processing bandwidth of the demodulation system is equivalent to $f_s/6$. Thus, the demodulation system according to the present invention has a minimum bandwidth increase of 25% by reducing the sampling frequency to $3\omega_c$ from $4\omega_c$ of conventional systems.

Once the odd and even harmonic components have been extracted with the gains of the odd and even channels matched, the demodulator 22 takes that square root of the sum of the squares and uses that value to normalize the signals with first and second normalizers 30, 32 prior to decoding the phase information. The normalized odd and even components are decoded using either an analog or a digital differentiate and cross-multiply decoder having first and second differentiators 34, 36 and first and second multipliers 40, 42. The differentiated and cross multiplied components are then differenced with a differencer 44 completing the recovery of the signal of interest Dcoswh(t).

When employing the demodulation system and method with a multi-element sensor group, the phase of the carrier $Ph_c$ is a function of the time delay due to the spacing of the acoustic elements relative to the photodetector. The Ccos $(Ph_c)$ term of the modulated signal f(t) represents a phase shift in the measured signal of interest $D\cos\omega_h(t)$. This term, $C\cos(Ph_c)$, does not have a time variable because the spacing between the multiple elements in the system are fixed. The phase delay is removed by adjusting the phase of a local oscillator to match the phase of the measured signal of interest $D\cos\omega_h(t)$, thereby resulting in zero channel to channel phase delay. The local oscillator is synonimous to the signals being used at the multipliers 24, 26 (i.e., the sin $(D\cos\omega_h(t))$ and the cos $(D\cos\omega_h(t))$ are the local oscillators).

Figure 3:
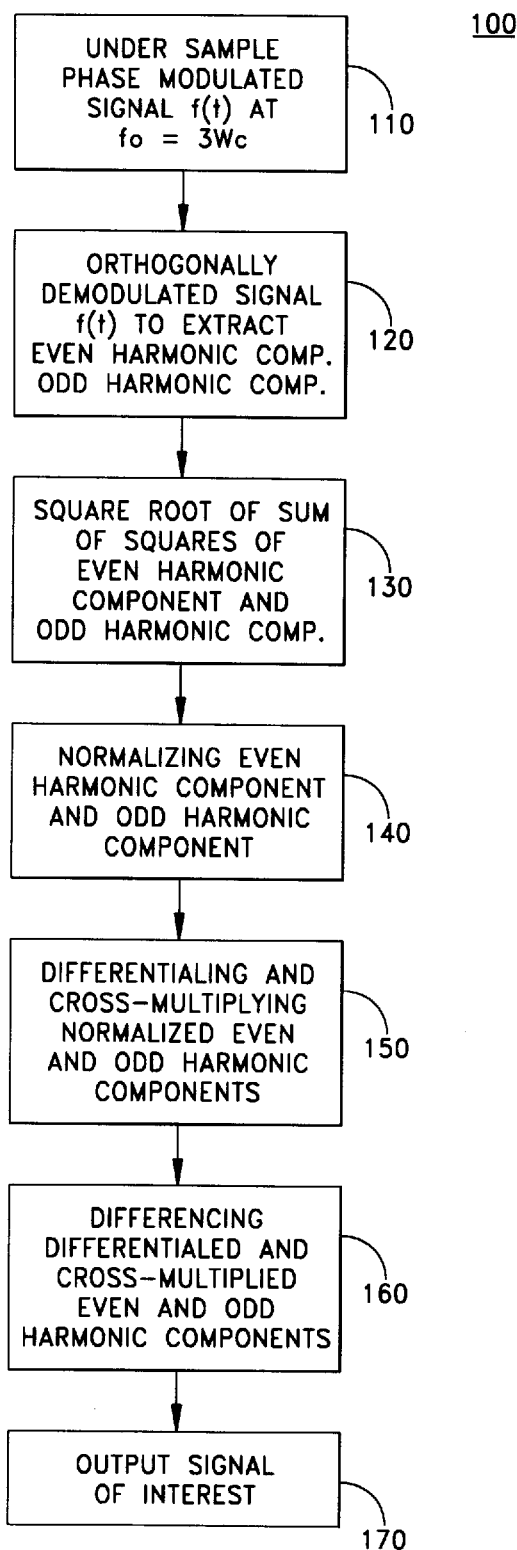
FIG. 3 is a flow chart of the method for recovering the signal of interest from an undersampled, modulated carrier signal according to the present invention.

The demodulation method 100 FIG. 3, according to the present invention, includes undersampling a modulated carrier f(t) at three times the phase generated carrier frequency $(3\omega_c)$, step 110. The undersampling at $3\omega_c$ results in aliasing the Bessel terms of the signal of interest into the sidebands of all the phase generated carrier terms, so that both the real and imaginary components of the signal of interest are available under a single phase generated carrier. In a fiber optic sensor system, the undersampling of the phase modulated optical signal is performed when the optical signal is pulsed (for TDM) or when the optical signal is photodetected and converted to an electronic signal.

The undersampled, modulated function f(t) is then orthogonally demodulated to extract even and odd harmonic components of the signal of interest, step 120. The orthogonal demodulation step is accomplished by multiplying or mixing the undersampled, modulated signal by signals having the form $\cos(\omega_c(t_o))$ and $\sin(\omega_c(t_o))$.

Once the even and odd components of the signal of interest have been extracted so that the amplitude of the components is matched, the square root of the sum of the squares is calculated, step 130, and used for normalizing the signals step 140, prior to decoding the phase information.

The normalized even and odd harmonic components are then differentiated and cross-multiplied, step 150, and differenced, step 160, to further decode and recover the signal of interest, step 170.

Accordingly, the demodulation system and method of the present invention allows a measured signal of interest to be recovered from an undersampled, modulated signal using a single phase generated carrier. The demodulation system and method requires less demand on both the sampling and demodulation circuitry. Used in a sensor system, the demodulation system and method maximizes the sensors' demodulated bandwidth relative to the sensors' sampling frequency.

In light of the above, it is therefore understood that within the scope of the appended claims, the invention may be practiced otherwise than as specifically described.

What is claimed is:

1. A method of recovering at least one signal of interest $D\cos\omega_h(t)$ from at least one undersampled, modulated carrier (f(t)), wherein the signal of interest is detected by at least one sensor and modulates a carrier signal $(\omega_c(t))$ to form the undersampled, modulated function (f(t)) having the form $f(t)=A+B\sin(C\cos(\omega_c(t)+Ph_c)+D\cos(\omega_h(t))+Ph_i(t))$ where:

A, B=detection factors,
C=amplitude of the carrier signal,
$\omega_c$=the carrier signal frequency $(2\pi f)$,
$Ph_c$=phase of the carrier signal relative to the sensor,
D=amplitude of the signal of interest,
$\omega_h$=radian frequency of the signal of interest, and
$Ph_i(t)$=environmentally induced phase noise;

said method comprising the steps of:
receiving the undersampled, modulated carrier;
orthogonally demodulating said undersampled, modulated carrier by multiplying said undersampled, modulated carrier by $\cos(\omega_c(t_o))$ to extract an even harmonic component of said signal of interest and multiplying said undersampled, modulated carrier by $\sin(\omega_c(t_o))$ to extract an odd harmonic component of said signal of interest; and
further demodulating said even harmonic component and said odd harmonic component of said signal of interest to recover said signal of interest.

2. The method of claim 1 wherein said undersampled, modulated carrier has been sampled at three times the carrier signal frequency $(3\omega_c)$.

3. The method of claim 1 wherein said at least one sensor includes a fiber optic sensor in an array of fiber optic sensors; and where:

A=the DC level of the light; and
B=the mixing efficiency of the sensor and the intensity of light.

4. The method of claim 3 wherein said array of fiber optic sensors include an array of interferometers.

5. The method of claim 3 wherein said undersampled, modulated carrier is photodetected.

6. The method of claim 1 wherein said at least one signal of interest includes a plurality of signals of interest, said plurality of signals being multiplexed from a plurality of sensors.

7. The method of claim 6 wherein said plurality of signals are multiplexed from said plurality of sensors using at least one of time division multiplexing and wavelength division multiplexing.

8. The method of claim 1 wherein amplitudes of said even harmonic component and said odd harmonic component of said signal of interest are substantially equal.

9. The method of claim 1 wherein said step of further demodulating includes:

taking the square root of the sum of the squares of said even harmonic component and said odd harmonic component;

normalizing said even harmonic component and said odd harmonic component to form a normalized even harmonic component and a normalized odd harmonic component; and decoding said normalized even harmonic component and said normalized odd harmonic component, to recover said signal of interest.

10. The method of claim 9 wherein said step of decoding includes:

differentiating and cross-multiplying said normalized even harmonic component and said normalized odd harmonic component to form differentiated and cross-multiplied even and odd harmonic components; and differencing said differentiated and cross-multiplied even and odd harmonic components, to recover said signal of interest.

11. A system for recovering at least one signal of interest $D \cos \omega_h(t)$ from at least one undersampled, modulated carrier (f(t)), wherein the signal of interest is detected by at least one sensor and modulates a carrier signal ($\omega_c(t)$) to form said undersampled, modulated carrier (f(t)) having the form: $f(t)=A+B \sin(C \cos(\omega_c(t)+Ph_c)+D \cos(\omega_h(t))+Ph_f(t))$ where:

A, B=detection factors,
C=amplitude of the carrier signal,
$\omega_c$=the carrier signal frequency ($2\pi f$),
$Ph_c$=phase of the carrier signal relative to the sensor,
D=amplitude of the signal of interest,
$\omega_h$=radian frequency of signal of interest, and
$Ph_f(t)$=environmentally induced phase noise;

said system comprising:

means for receiving the undersampled, modulated carrier;

means for multiplying said undersampled, modulated carrier by $\cos(\omega_c(t_o))$ to extract an even harmonic component of said signal of interest;

means for multiplying said undersampled, modulated carrier by $\sin(\omega_c(t_o))$ to extract an odd harmonic component of said signal of interest; and means for further demodulating said even harmonic component and said odd harmonic component of said signal of interest to recover said signal of interest.

12. The system of claim 11 wherein said means for multiplying by $\cos(\omega_c(t_o))$ includes a multiplier.

13. The system of claim 11 wherein said means for multiplying by $\sin(\omega_c(t_o))$ includes a multiplier.

14. The system of claim 11 wherein said means for further demodulating said even harmonic component and said odd harmonic component includes:

means for taking the square root of the sum of the squares of said even harmonic component and said odd harmonic component;

means for normalizing said even harmonic component and said odd harmonic component to form a normalized even harmonic component and a normalized odd harmonic component; and means for decoding said normalized even harmonic component and said normalized odd harmonic component, to recover said signal of interest.

15. The system of claim 14 wherein said means for decoding includes:

a differentiate and cross-multiple decoder, responsive to said means for normalizing, for differentiating, cross-multiplying and differencing said normalized even harmonic component and said normalized odd harmonic component to recover said signal of interest.

* * * * *